United States Patent [19]

Hill

[11] Patent Number: 5,464,428
[45] Date of Patent: Nov. 7, 1995

[54] ENVIRONMENTALLY PROTECTED MEDICAL ELECTRONIC INSTRUMENT

[75] Inventor: Douglas J. Hill, Renton, Wash.

[73] Assignee: Physio-Control Corporation, Redmond, Wash.

[21] Appl. No.: 207,552

[22] Filed: Mar. 8, 1994

[51] Int. Cl.⁶ ........................................ A61N 1/08
[52] U.S. Cl. ................. 607/1; 607/2; 607/5; 128/710
[58] Field of Search ................... 607/1, 2, 36, 5; 128/710

[56] References Cited

U.S. PATENT DOCUMENTS

| D. 249,548 | 9/1978 | Napoli ........................... 128/710 |
| D. 287,758 | 1/1987 | Chennault et al. ................. 607/5 |
| 4,610,254 | 9/1986 | Morgan et al. ..................... 607/6 |
| 4,770,328 | 9/1988 | Dickhudt et al. .................... 607/2 |
| 5,265,616 | 11/1993 | Hoshino ......................... 128/710 |

*Primary Examiner*—William E. Kamm
*Assistant Examiner*—Kennedy J. Schaetzle
*Attorney, Agent, or Firm*—Seed and Berry

[57] ABSTRACT

An environmentally protected medical electronic instrument, such as a defibrillator. The defibrillator electronics are housed in an integrally formed rectangular container having an open top. Electronic components, particularly electronic components which cannot be readily shielded from environmental hazards, are accessible at the top of the container. These components are protected by a lid that is pivotally mounted on the container. Environmentally protected user interface components, such as an LCD display, key pad and audio transducer, are mounted on the upper surface of the lid so that they are readily accessible to the user.

19 Claims, 5 Drawing Sheets

ENVIRONMENTALLY PROTECTED MEDICAL ELECTRONIC INSTRUMENT

TECHNICAL FIELD

This invention relates to medical electronic instruments, and more particularly to a medical electronic instrument that is protected from rain, shock, wind and other environmental hazards, and is thus suitable for use outdoors.

BACKGROUND OF THE INVENTION

Medical electronic instruments are often highly sophisticated, complex systems that include a large number of electronic circuits and other components, such as displays, printers, keyboards, etc. Instruments of this nature are inherently prone to damage if the instruments are exposed to such environmental hazards as rain, snow, accumulated water, and shock.

Most medical electronic instruments are normally used in the controlled environment of a hospital, doctor's office, or the like. Such instruments are therefore generally not exposed to such environmental hazards as rain, snow, or accumulated moisture. Furthermore, they are generally either stationary or carried on a cart or other vehicle during transport so that they are not subject to shock, such as by being dropped onto a floor. However, some medical electronic instruments, by their very nature, must be used outdoors where they can readily be exposed to a variety of environmental hazards. Furthermore, some of these instruments are often used in emergency conditions where medical personnel cannot devote attention to protecting the instrument from these environmental hazards.

One type of medical electronic instrument that may be exposed to environmental hazards under emergency conditions is the portable defibrillator. For many years portable defibrillators have been supplied to emergency medical technicians who are called upon to respond to heart attack victims in a wide variety of settings. Modem portable defibrillators do far more than applying a controlled shock to heart attack victims in order to arrest fibrillation. For example, many defibrillators are of the automatic or semi-automatic variety in which the defibrillator determines whether defibrillation is indicated based on the condition of the patient. Automatic or semi-automatic defibrillators normally include a medical monitor for obtaining the patient's electrocardiogram ("ECG") for use in determining whether defibrillation is indicated. These defibrillators often include a strip chart recorder for allowing the emergency medical technicians to view the patient's ECG and to provide a permanent record of the ECG as well as the time of occurrence of pertinent events, such as the time that a defibrillation pulse is generated.

Modem automatic or semi-automatic defibrillators having the above described capabilities contain a great deal of complex circuitry that can become temporarily or permanently inoperative if exposed to such environmental hazards as water or mechanical shock. Similarly, such defibrillators often use relatively fragile and difficult to protect components such as strip chart recorders or display screens. It is therefore important for both economic and safety reasons to ensure that such defibrillators are not damaged by environmental hazards. However, despite the importance of doing so, defibrillators are often damaged by environmental hazards primarily because their physical packaging is not designed to protect the defibrillators, particularly in view of the circumstances under which they are used and the type of individual using them.

Approximately 500,000 heart attacks occur each year outside the hospital, many at home. In the process of rescue defibrillators are inherently exposed to a variety of environmental hazards such as rain, snow, mud, mechanical shocks and vibration. When the emergency medical technician reaches the scene of a heart attack, he or she must act quickly to save the victim, and the emergency medical technician is understandably devoting his or her attention to the victim rather than to safeguarding the defibrillator. Under these circumstances, the defibrillator may be damaged by environmental hazards. For example, after speeding to the scene of a heart attack and then running to the heart attack victim, the emergency medical technician may drop the defibrillator into a puddle of water while devoting his or her attention to quickly attaching defibrillation electrodes to the chest of the victim. The defibrillator will thus be exposed to both water and shock. If this water or shock disables the defibrillator, the victim could die and, in any case, the defibrillator would require expensive repair.

As mentioned above, portable defibrillators traditionally have been used by trained emergency medical technicians since training has been considered necessary to properly diagnose conditions requiring defibrillation. With the advent of automatic and semi-automatic defibrillators, even untrained individuals can successfully defibrillate heart attack victims. As a result, portable defibrillators are now being supplied to a wide variety of relatively untrained individuals, such as police officers, security guards, office personnel, and athletic coaches. While attempts can be made to train emergency medical technicians to safeguard portable defibrillators in emergency conditions, such training does not seem likely to be successful in educating these less trained individuals to adequately protect portable defibrillators from environmental hazards. For these reasons, it seems likely that ever increasing numbers of portable defibrillators and other medical electronic instruments will continue to be exposed to environmental hazards.

In the past, there have been two approaches to packaging portable medical electronic instruments, such as defibrillators. One approach has been to package such instruments in essentially the same manner as hospital based medical electronic instruments, i.e., to not significantly protect such instruments from the environment. Often the only accommodations to making such instruments portable have been attempts to make then relatively small and lightweight, and to provide them with a handle. Needless to say, such instruments are prone to damage when they are exposed to environmental hazards under emergency conditions.

Another approach to packaging portable electronic instruments has been to entirely shield them from the external environment, such as by packaging them in a closed weatherproof container. While this approach may be satisfactory for some types of electronic instruments, it is not acceptable for medical electronic instruments which must be operated and viewed during use. For example, individuals should be able to view the patient's ECG on a strip chart record prior to and after defibrillation. Yet it is not possible to do so if the strip chart recorder is buried deep in an enclosed weatherproof container. On the other hand, strip chart recorders inherently have external openings (since the strip chart paper must be fed out through openings), thus making it impossible for the strip chart to be protected from the environment. Similar constraints exist for other components, such as keyboards, displays, connectors, etc.

SUMMARY OF THE INVENTION

It is the primary object of the invention to provide a medical electronic instrument that is both readily accessible for use and yet is protected from environmental hazards.

It is another object of the invention to provide a medical electronic instrument that, despite being adequately protected from environmental hazards, is still readily accessible for use.

It is still another object of the invention to provide an environmental protection technique that can be easily adapted to a variety of medical electronic instruments.

These and other objects of the invention are provided by an environmentally protected medical electronic instrument having a plurality of electronic components. The electronic components are mounted in a container having an open top, a bottom, and sidewalls having lower edges joined to the bottom in a watertight manner so that the electronic components are accessible through the open top of the container. The bottom and sidewalls of the container may be either separate components or they may be integrally formed with each other. A lid is mounted on the container so that it is alternately movable between a closed position and an open position. In its closed position, the lid covers the open top of the container, and the electronic components are accessible therethrough. In its open position, the lid is removed from the top of the container to access the electrical components. A plurality of water resistant user interface components are mounted on the upper surface of the lid so that the user interface components are visible and readily accessed by a user when the lid is in its closed position. The user interface components are electrically connected to the medical electronic components mounted in the container so that the electronic components can be readily operated while they remain protected from environmental hazards.

Although the medical electronic components may be mounted on the internal walls of the container, they are preferably mounted in a separate chassis that is enclosed by the container. In fact, the chassis preferably includes a plurality of separate watertight enclosures each of which contain a respective medical electronic component. As a result, water accidentally entering one of the enclosures and causing the medical electronic component contained therein to malfunction will not cause a malfunction of medical electronic components contained in other enclosures. The medical electronic instrument preferably includes a resilient bumper extending along the upper edge of the sidewalls. The resilient bumper may be sealed to the sidewalls of the container and to the chassis thereby sealing the area between the container and chassis from the external environment.

DETAILED DESCRIPTION OF THE INVENTION

Figure 1:
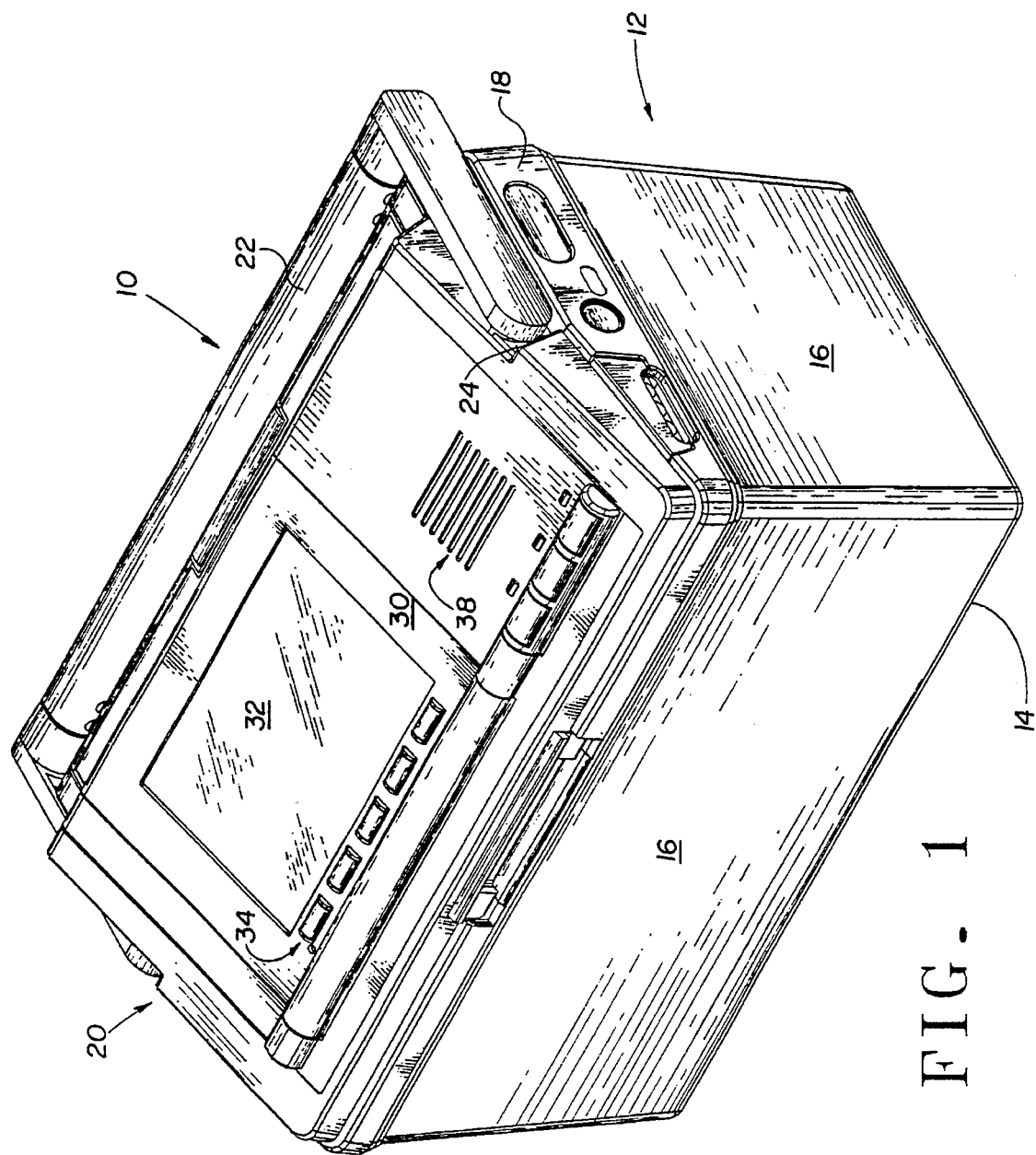
FIG. 1 is an isometric view of one embodiment of an environmentally protected medical electronic instrument of the present invention.

One embodiment of a medical electronic instrument, environmentally protected in accordance with the present invention, is illustrated in FIG. 1. The instrument illustrated in FIG. 1 is a semi-automatic defibrillator 10 which is often used in the presence of environmental hazards under emergency conditions. The circuitry used in the defibrillator 10 is conventional and may be implemented with a large variety of circuitry well known to one skilled in the art. However, the inventive environmentally protected electronic instrument could also be other types of medical instruments such as ECG monitors, blood pressure monitors, etc. Accordingly, the inventive environmental protection system is not limited to a defibrillator having the components illustrated in FIG. 1 or to any particular type of medical electronic device.

The defibrillator 10 illustrated in FIG. 1 includes a base portion formed by a generally rectangular container 12 having a bottom 14 with its edges connected to four sidewalls 16 (only two of which are illustrated in FIG. 1). In the embodiment illustrated in FIG. 1, the bottom 14 and sidewalls 16 are integrally formed with each other so as to form a watertight container. However, the bottom 14 and sidewalls 16 could be separate pieces which are joined to each other at their edges with an adhesive, ultrasonic welding, or the like. A resilient bumper 18 extends around the upper edges of the sidewalls 16. As explained in greater detail below, the bumper 18 performs the dual functions of cushioning the defibrillator 10 against shocks incurred by accidentally bumping the defibrillator 10 against objects and it seals the space between the container 12 and internal components.

The container 12 is open at its top so that medical electronic components mounted in the container 12 are accessible. Certain medical electronic components, such as strip chart recorders, tape recorders, connector jacks and the like, cannot easily be made waterproof. However, these components are protected by a lid 20 that is pivotally mounted to the rear sidewall 16 (not shown in FIG. 1) so that the lid 20 can pivot upwardly to allow access to the medical electronic components mounted within the container 12. A handle 22 has its ends pivotally secured to respective mounts 24 projecting upwardly from the case 12.

The lid 20 has a forwardly inclined upper surface 30 on which are mounted an LCD panel 32, a set of "soft keys" 34 for controlling the operation of the defibrillator 10 by pressing keys 34 corresponding to designations on the LCD panel 32. Furthermore, the LCD panel is hinged at the lower edge allowing the viewing angle of the display to be adjusted. The components 32–38 mounted on the upper surface of the lid 20 constitute the user interface components which must be easily visible and readily accessible to operate the defibrillator 10. Significantly, the user interface components 32–38 are of the type that can be made waterproof with relative ease and little expense. Thus, the waterproof user interface components 32–38 are readily accessible while the electronic components, some of which cannot be easily be made waterproof, are protected from environmental hazards by the lid 20.

It should be apparent that the inventive environmentally protected medical electronic instrument illustrated in FIG. 1 has many advantages over conventional defibrillators. When an emergency medical technician responds to a call for assistance, he or she can place the defibrillator 10 on the ground adjacent the victim without concern about whether the ground is wet, muddy, covered with snow, etc. Thus, the emergency medical technician need not waste valuable time finding a safe location to place the defibrillator 10. If, in hurrying to the heart attack victim, the emergency medical technician bangs the defibrillator 10 against the emergency vehicle or the wall of a building, for example, the shock that would otherwise be imparted to the defibrillator 10 is largely absorbed by the resilient bumper 18. Furthermore, as explained below, the medical electronic components container within the container 12 are preferably mounted in a chassis that is separate, and resiliently isolated, from the container 12. After the emergency medical technician places electrodes on the heart attack victim, all of the user interface components 32–38 are readily accessible so that the patient's ECG can be easily viewed on the LCD panel 32 and the keys for operating the defibrillator 10 can be readily manipulated. At the same time, the waterproof nature of the user interface components 32–38 and the protection that the lid 20 provides the medical electronic components in the container 12 prevents the defibrillator 10 from being damaged by any conceivably environmental hazard.

Figure 2:
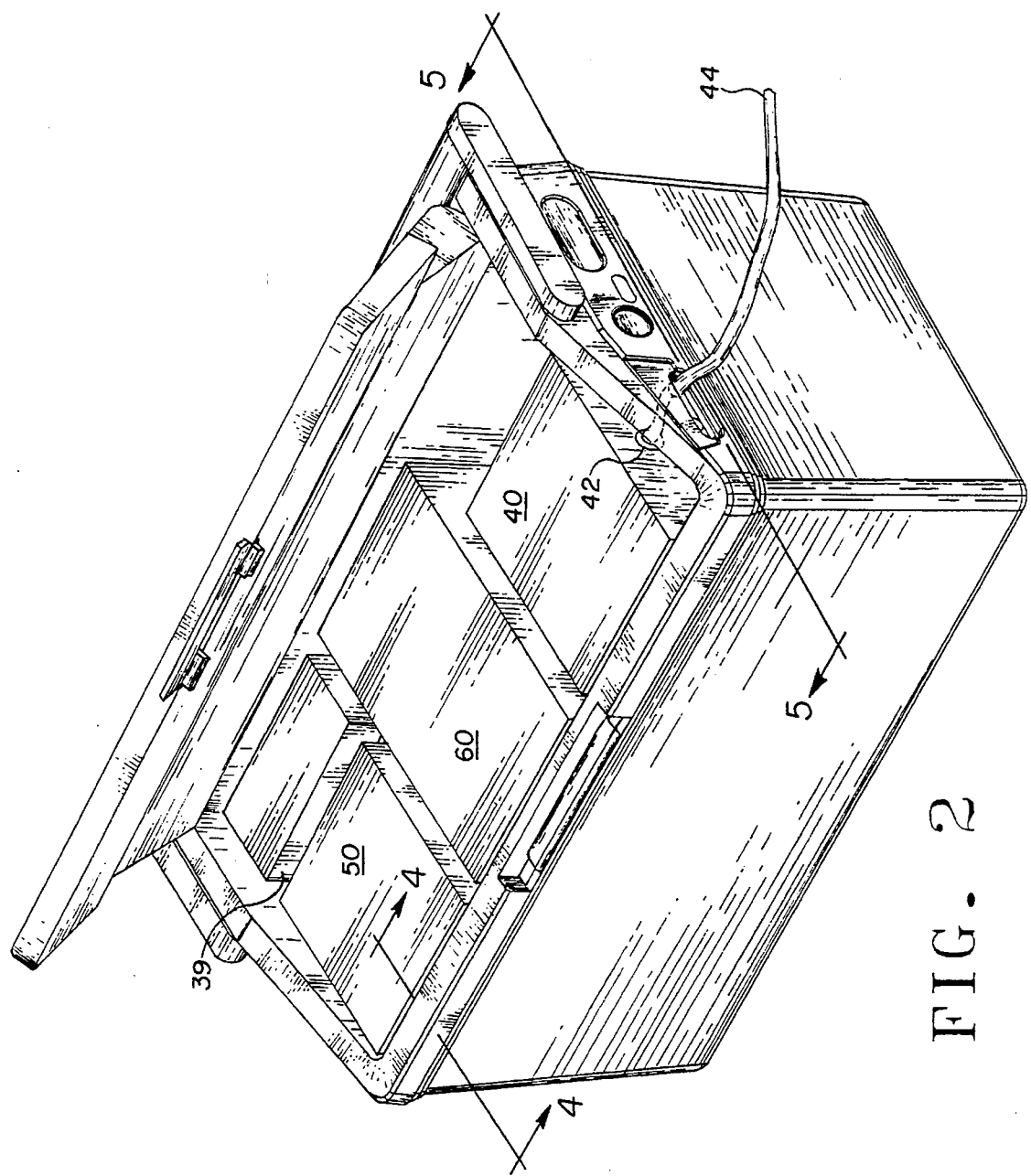
FIG. 2 is an isometric view of the environmentally protected medical electronic instrument of FIG. 1 showing the instrument cover in its open position.

The defibrillator 10 of FIG. 1 is shown in FIG. 2 with the lid 20 open and the internal medical electronic components accessible through the top surface 39 of the container 12. As illustrated in FIG. 2, defibrillator 10 includes an ECG monitor module 40 having a connector jack 42 into which a respective electrode cable 44 is inserted. The electrode cable 44 passes beneath a bumper insert 48 described in greater detail below and terminates in monitoring electrodes (not shown) that are attached to the heart attack victim.

The defibrillator 10 also includes a strip chart recorder 60 of conventional design. Like the ECG monitor module 40, it would be difficult to shield the recorder 60 from moisture if it was exposed to the environment because the recorder 60 must have an opening for the strip chart paper to pass through. Furthermore, the strip chart paper would become wet after it was ejected from the strip chart recorder. Once again, by placing the strip chart recorder 60 beneath the lid 20, it is shielded from moisture yet is readily accessible by pivoting the lid 20 upward to its open position.

The defibrillator 10 may also include other components that would be difficult to shield from moisture using sealed, waterproof membranes and the like. For example, the defibrillator 10 illustrated in FIG. 2 includes a cassette tape recorder 50 of conventional design for magnetically recording the ECG of a patient. The tape recorder 50, like the strip chart recorder 60 and ECG monitor module 40, is shielded from external moisture by the lid.

Figure 3:
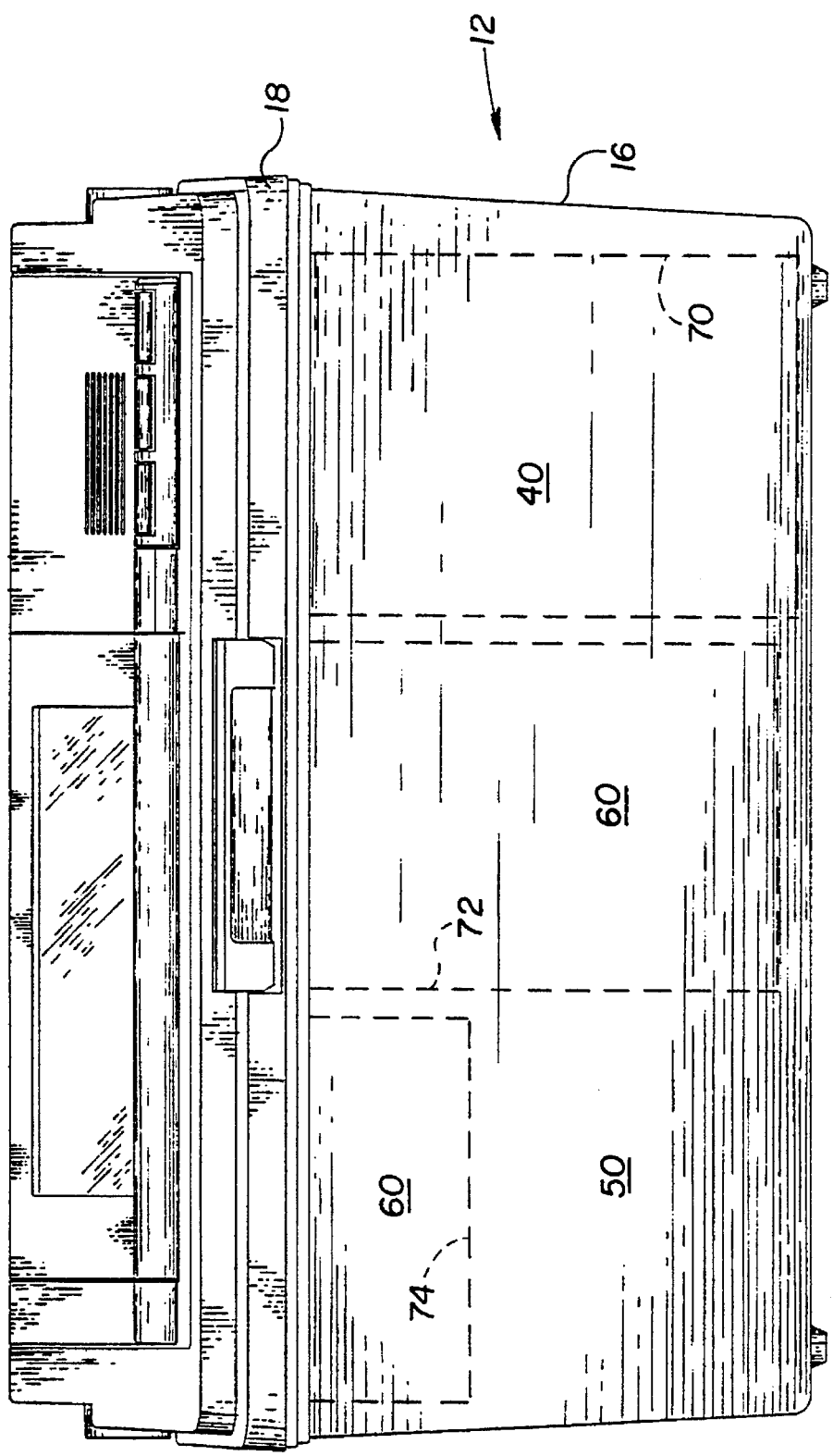
FIG. 3 is a front elevational view of the environmentally protected medical electronic instrument of FIG. 1 showing the manner in which the internal components of the instrument are mounted in respective enclosures.

The manner in which the electronic components 40–60 of the defibrillator 10 are mounted within the container 12 is best illustrated in FIG. 3. Each of the components 40–60 is preferably mounted in a respective watertight enclosures 70–74. The enclosures 70–74 thus form a chassis that is separate from the container 12. In fact, the enclosures 70–74 are preferably secured to the container 12 by the resilient bumper 18 so that the bumper 18 not only seals the space between the container 12 and the enclosures 70–74, but it also shock mounts the enclosures 70–74 in the container 12. Furthermore, if water is accidentally allowed to get into one of the enclosures, for example the enclosure 72 housing the strip chart recorder 60, any malfunction caused by the water would be limited to the single component, and other components mounted in other enclosures 70–74 could not be affected. In contrast, the electrical components of conventional medical electronic devices are either not mounted in separate enclosures or they are not moisture isolated from each other. The components 40–60 are, of course, electrically interconnected to each other and to some of the user interface components 32–38. However, the components 40–60 can be interconnected by conductors that are molded into the walls of the enclosures 70–74 so that moisture cannot pass through the conductor path.

Figure 4:
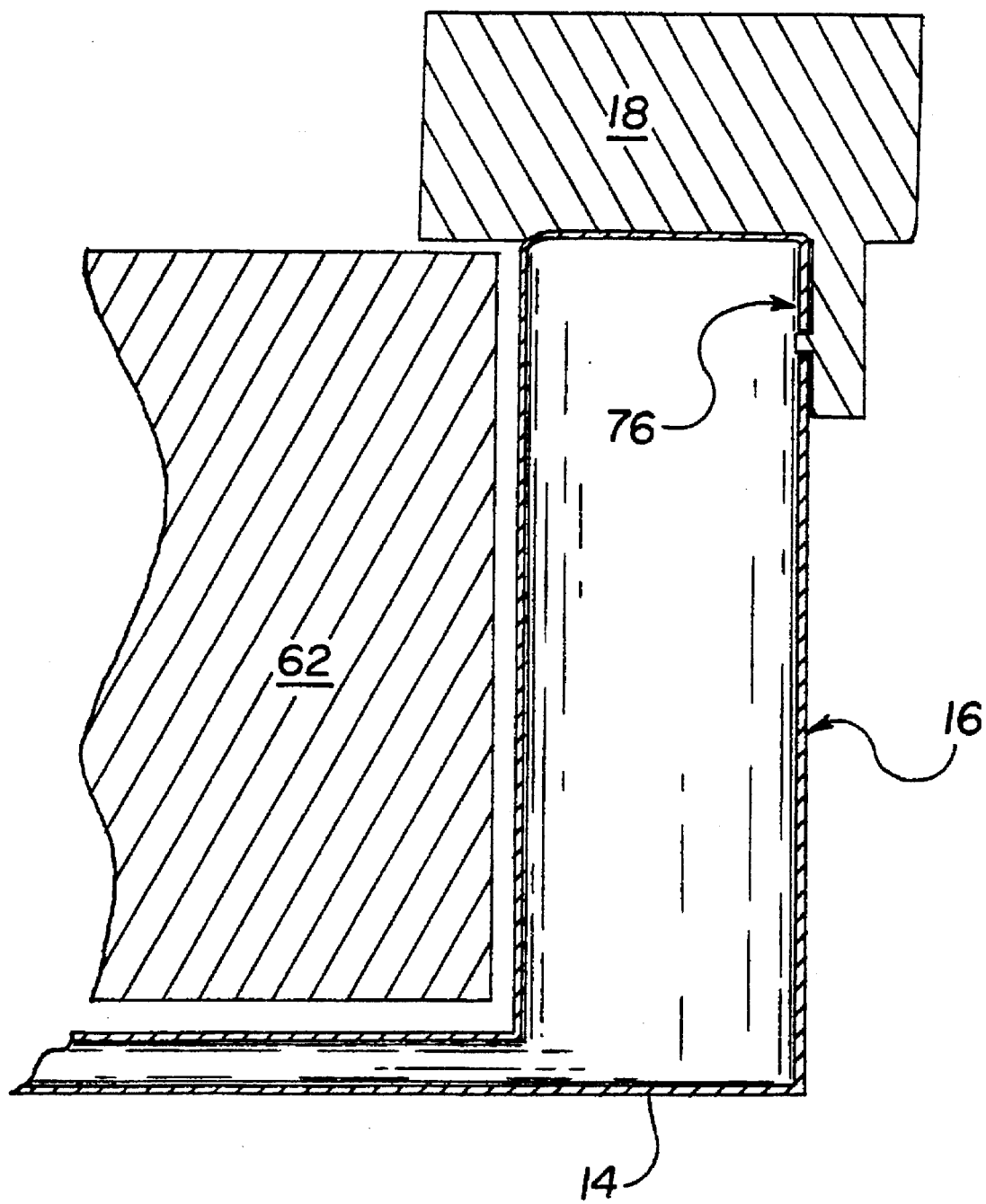
FIG. 4 is a cross-sectional view taken along the line 4—4 of FIG. 2 showing the bumper used to protect the instrument from shocks and to seal the internal chassis and the surrounding case.

The manner in which the bumper 18 protects the medical electronic device from moisture is illustrated in FIG. 4. As mentioned above, the sidewalls 16 of the container 12, as well as the upper edges of the enclosures 70–74 are sealed to the other side of the bumper 18 as illustrated in FIG. 4.

Figure 5:
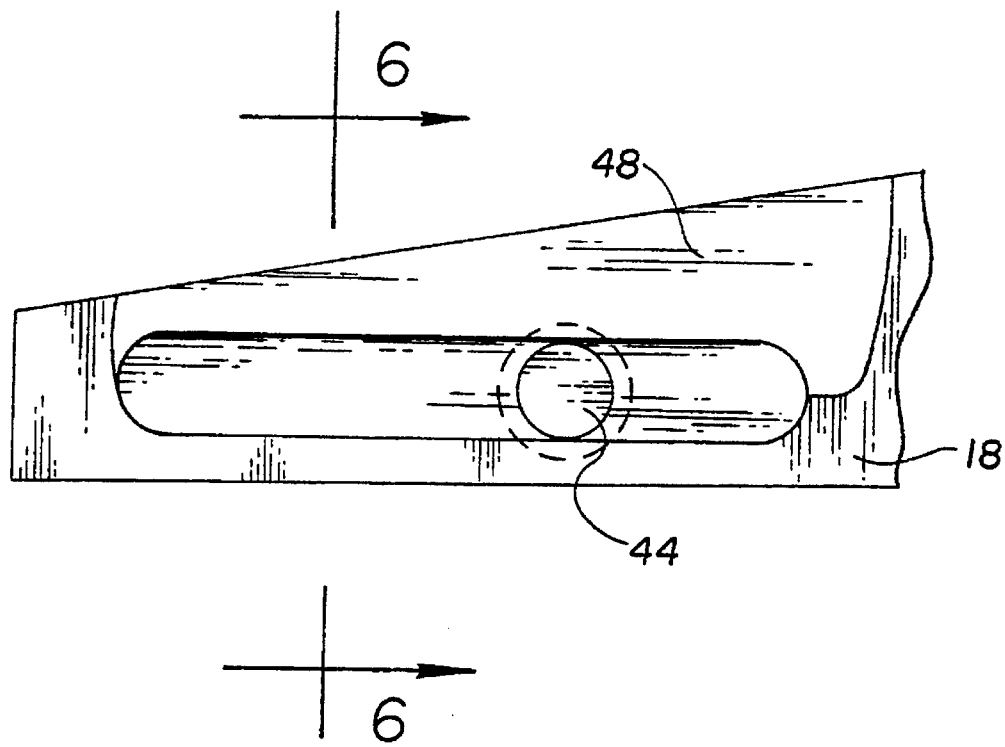
FIG. 5 is a cross-sectional view taken along the line 5—5 of FIG. 2 showing the manner in which electrode leads pass through a removable bumper insert.
Figure 6:
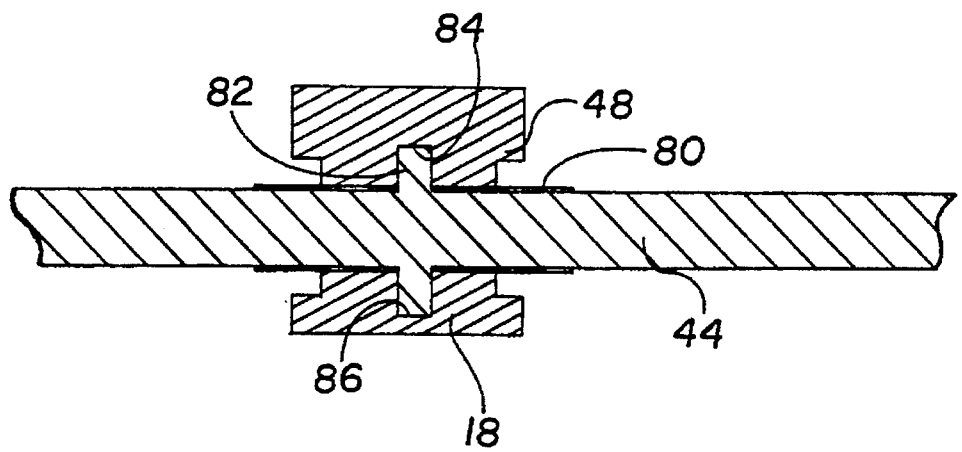
FIG. 6 is a cross-sectional view taken along the lines 6—6 of FIG. 5.

As illustrated in FIG. 2, it is necessary for the electrode cable 44 to pass through the bumper 18 in order to connect to respective monitoring electrodes. The inventive environmentally protected defibrillator 10 is specially adapted to prevent moisture from passing through the area of the bumper 18 that is penetrated by the electrode cable 44. The manner in which this is accomplished is illustrated in FIGS. 5 and 6. As the cable 44 passes through the bumper 18 and bumper insert 48, it is surrounded by a sleeve 80, which contains an integrally formed, outwardly projecting radial flange 82. The flange 82 is received by an annular groove 84, 86 formed in the bumper insert 48 and bumper 18, respectively. The interfit between the flange 82 and grooves 84, 86 serves to both prevent axial movement of the electrode cables 44 and to prevent moisture from seeping along the electrode cables 44 as they pass through the bumper 18.

The inventive environmentally protected medical electronic instrument is thus shielded from virtually all environmental hazards that are commonly encountered. Yet despite this protection, the user interface components are readily accessible so that the environmental protection does not impair the efficient use of the medical instrument.

I claim:

1. An environmentally protected medical electronic instrument, comprising:

a container having a bottom, sidewalls having lower edges joined to said bottom in a watertight manner, and an open top;

medical electronic components mounted in said container and accessible through the open top of said container;

a lid mounted on said container so that said lid is alternately movable between a closed position in which said lid covers the open top of said container and the electronic components are accessible therethrough and an open position in which said lid is removed from above the top of said container to access said electrical components; and water resistant user interface components mounted on the upper surface of said lid so that said user interface components are visible and readily accessed by a user when said lid is in its closed position, said user interface components being electrically connected to the medical electronic components mounted in said container.

2. The environmentally protected medical electronic instrument of claim 1 wherein the bottom and sidewalls of said container are integrally formed with each other.

3. The environmentally protected medical electronic instrument of claim 1 wherein said medical electronic components mounted in said container include at least one of an environmentally vulnerable strip chart recorder, and an environmentally vulnerable magnetic tape recorder.

4. The environmentally protected medical electronic instrument of claim 1 wherein said medical electronic components are mounted in a chassis that is enclosed by said container.

5. The environmentally protected medical electronic instrument of claim 4 wherein said chassis includes a plurality of separate enclosures each of which includes a bottom, sidewalls having lower edges joined to said bottom in a watertight manner, and an open top, said enclosures containing respective ones of said medical electronic components so that water accidentally entering one of said enclosures and causing the medical electronic component contained in said enclosure to malfunction will not cause malfunctioning of medical electronic components contained in respective other enclosures.

6. The environmentally protected medical electronic instrument of claim 4, further including a resilient bumper extending along the upper edge of said sidewalls, said resilient bumper being sealed to the sidewalls of said container and to said chassis thereby sealing the area between said container and chassis from the external environment.

7. The environmentally protected medical electronic instrument of claim 1, further including a resilient bumper extending along the upper edge of said sidewalls beneath said lid.

8. The environmentally protected medical electronic instrument of claim 7 wherein said instrument further includes a plurality of instrument leads extending from one of said medical electronic components to a patient, said instrument further including a bumper insert removably positioned in a recess of said bumper above said leads so that said leads can pass through said bumper.

9. The environmentally protected medical electronic instrument of claim 8 wherein said leads are surrounded by respective outwardly projecting stop members that fit into respective recesses in said bumper insert thereby sealing the interface between said leads and bumper insert and preventing axial movement of said leads relative to said bumper insert.

10. The environmentally protected medical electronic instrument of claim 1 wherein the upper surface of said lid is angled in one direction thereby making the user interface components mounted on the upper surface of said lid more visible and accessible from one side of said medical electronic instrument.

11. The environmentally protected medical electronic instrument of claim 1 wherein said interface components include a flat panel display, said flat panel display being pivotally mounted to said lid along one edge thereof so that the viewing angle of said display may be adjusted.

12. The environmentally protected medical electronic instrument of claim 1, further including a handle having opposite ends secured to spaced apart locations on said container.

13. The environmentally protected medical electronic instrument of claim 1 wherein said electronic instrument is a defibrillator.

14. The environmentally protected medical electronic instrument of claim 1, further including a plurality of separate enclosures each of which includes a bottom, sidewalls having lower edges joined to said bottom in a watertight manner, and an open top, said enclosures containing respective ones of said medical electronic components so that water accidentally entering one of said enclosures and causing the medical electronic component contained in said enclosure to malfunction will not cause malfunctioning of medical electronic components contained in respective other enclosures.

15. The environmentally protected medical electronic instrument of claim 1 wherein one edge of said lid is pivotally connected to one edge of a sidewall of said container so that said lid may be pivoted between its open and closed positions.

16. A method of protecting the electronic components of a medical electronic instrument from environmental hazards while allowing said medical electronic instrument to be readily used, said method comprising:

placing said medical electronic components in a water resistant container having an open top so that said medical electronic components are accessible through the open top of said container;

mounting a lid on said container;

moving said lid between a closed position in which said lid covers the open top of said container and the electronic components are accessible therethrough and an open position in which said lid is removed from above the top of said container to access said electrical components;

mounting water resistant user interface components on the upper surface of said lid so that said user interface components are visible and readily accessed by a user when said lid is in its closed position; and connecting said user interface components to the medical electronic components mounted in said container.

17. The method of claim 16, further including the step of mounting said medical electronic components in a chassis that is enclosed by said container.

18. The method of claim 16, further including the step of placing at least some of said medical electronic components in respective enclosures each of which includes a bottom, sidewalls having lower edges joined to said bottom in a watertight manner, and an open top so that water accidentally entering one of said enclosures and causing the medical electronic component contained in said enclosure to malfunction will not cause malfunctioning of medical electronic components contained in respective other enclosures.

19. The method of claim 16, further including the steps of placing a resilient bumper along the upper edge of said sidewalls, and sealing said bumper to the sidewalls of said container and to said chassis thereby sealing the area between said container and chassis from the external environment.

* * * * *